United States Patent [19]

Ragard

[11] 3,780,415

[45] Dec. 25, 1973

[54] DUAL IN-LINE SOCKET INSERTION APPARATUS

[75] Inventor: Phillip A. Ragard, Binghamton, N.Y.

[73] Assignee: Universal Instruments Corporation, Binghamton, N.Y.

[22] Filed: Mar. 20, 1972

[21] Appl. No.: 236,261

[52] U.S. Cl. .............................................. 29/203 B
[51] Int. Cl. .......................................... H05k 13/04
[58] Field of Search ...................... 29/203 B, 203 R, 29/203 D, 208 D

[56] References Cited

UNITED STATES PATENTS 3,616,509 11/1971 Zemek et al. .................... 29/203 B

*Primary Examiner*—Thomas H. Eager
*Attorney*—Morris Fidelman et al.

[57] ABSTRACT

An apparatus for aligning the leads of dual in-line sockets and inserting them into a printed circuit board featuring a rotatable grooved lead aligner which acts on leads depending from a pair of biased latches and then swings away to allow a driver having a biased insertion head to move vertically downward, engage the latches to swing them apart and force the component into the printed circuit board.

10 Claims, 8 Drawing Figures

FIG I

DUAL IN-LINE SOCKET INSERTION APPARATUS

This invention relates to a novel apparatus for aligning the leads of dual in-line sockets and inserting them into predetermined aligned holes in printed circuit boards.

A dual in-line socket has a generally rectangular body with an equal number of leads, usually six to eight, extending from opposite sides of the body and being then directed downwardly in parallel planes. These sockets are utilized to hold dual inline components, commonly referred to as DIPs, on printed circuit boards.

The instant apparatus is adapted to receive sockets, align the leads to insure that they enter holes in a printed circuit board in a correct manner, and then insert them into the printed circuit or PC board. The apparatus utilizes a driver bar having an insertion head which is biased in relation to the main part of the driver bar. A linkage arrangement utilizing a pneumatic cylinder and limited relative movement between the driver bar and a yoke carrying the cylinder is employed to suspend the lead aligning mechanism below and between a pair of spring biased pivotal latches which hold the socket in position. Any conventional feeding means may be employed to feed sockets onto the latches. The socket feed mechanism forms no part of the instant invention and is neither shown nor described.

The lead aligning mechanism employs a pneumatic cylinder means to actuate a rack and gear arrangement which, in turn, rotates a grooved member. The grooved member cooperates with a pair of elongated members to engage and straighten the leads. The rotatable grooved member is located below and between the spring-biased pivoted component holding latches.

Accordingly it is an object of this invention to provide a novel socket lead aligning and insertion mechanism.

Another object of this invention is to provide a simple mechanism for aligning the leads of dual in-line sockets.

A further object of this invention is to provide a unique mechanism for swinging a lead aligning mechanism out of the path of a driver member in an insertion apparatus.

These and other objects of this invention will become apparent when reference is had to the accompanying specification and drawings in which.

Figure 1:
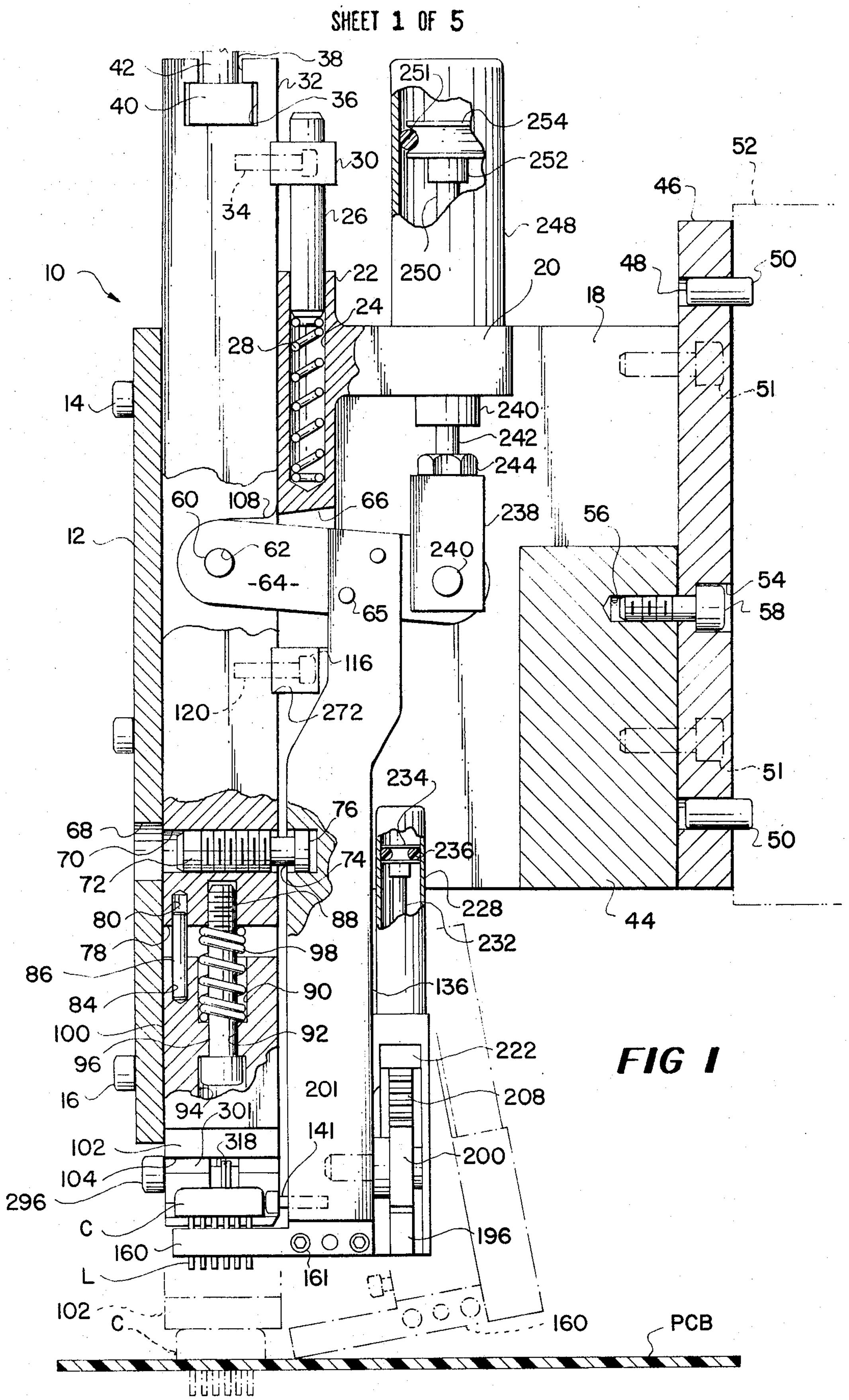
FIG. 1 is a side view, partially in section, of the insertion apparatus comprising this invention.
Figure 2:
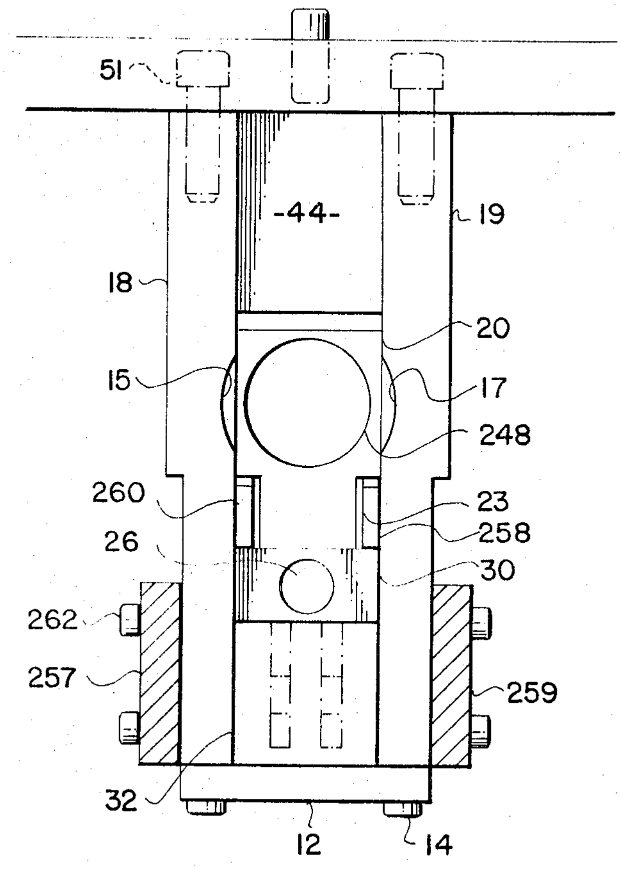
FIG. 2 is a top plan view of the apparatus of FIG. 1.

Referring now to FIG. 1, there is shown a side view, partially in section, of the apparatus designated generally as 10. Machine screws, such as 14,16 secure a front mounting plate 12 to the main housing members 18 and 19 (FIG. 2). Mounted between members 18 and 19 for vertical movement therebetween is support block 20. The inner sides of members 18 and 19 are relieved as at 15,17 as shown in FIG. 2. Support block 20 is integral with slide member 22 (FIG. 5) which has a vertical bore 24 therein for receiving the end of a guide pin 26. Pin 26 moves within bore 24 against the bias of compression spring 28 with the movement of driver member 32. A securing block 30, having a split bore as at 33 (FIG. 5) receives the upper end of pin 26 and it is secured to driver member 32 by machine screws such as 34. Machine screws 34 also hold pin 26 relative to block 30 in a predetermined relationship which can be adjusted simply by loosening screws 34.

The upper end of driver member 32 is cut away as at 38 and at 36 to provide a notch for receiving the end of a driving bar 40. Bar 40 can be driven vertically in a reciprocal fashion by any one of a number of conventional mechanisms, e.g., a pneumatic piston and cylinder.

Figure 5:
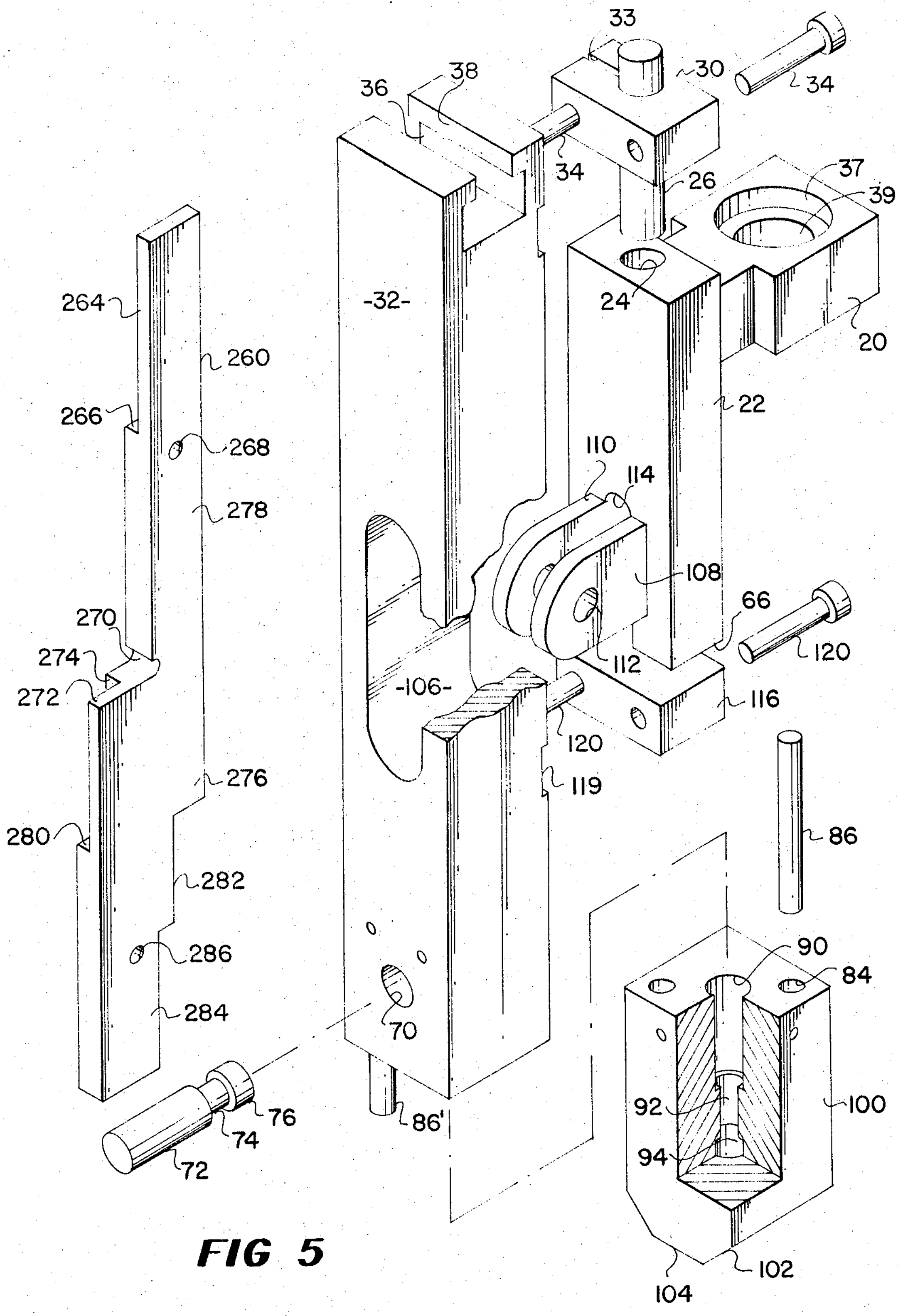
FIG. 5 is an exploded perspective view of the driver bar and insertion head assembly of the apparatus.
Figure 6:
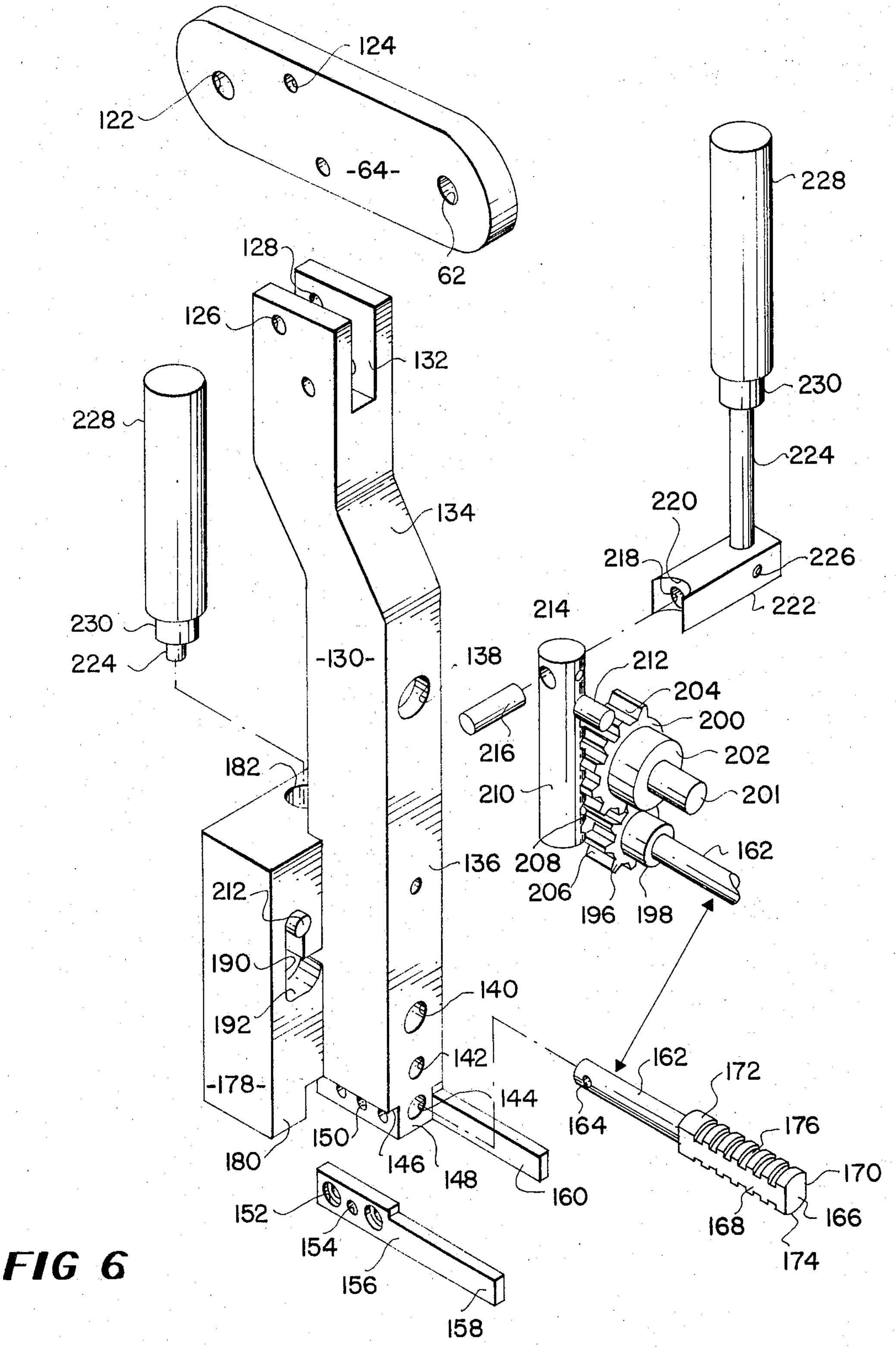
FIG. 6 is an exploded perspective view of the lead aligning actuator mechanism and the linkage assembly for swinging the aligning assembly out the path of the insertion head.

Driver 32, as shown in FIGS. 2 and 5, is mounted for vertical reciprocal movement between members 18 and 19. It contains a cut-out area 106 as shown in FIG. 5. Adapted to be received within area 106 are a pair of spaced apart ears 108 and 114 having coaxial bores such as 112 therein. The portion of member 22 between ears 108 and 114 is also cut away as at 114. This cut-out area 114 and the space between ears 108 and 110 is adapted to accommodate link member 64 as seen in FIGS. 2 and 6.

A stop member 116 having bores such as 118 is received within notch 119 in driver 32. Machine screws such as 120 are adapted to secure the stop member to driver 32.

Driver 32 has a centrally located threaded bore 70 therein which threadably receives locking screw 72. Screw 72 has a narrow diameter extension portion 74 terminating in head portion 876, the function of which is hereinafter described.

The bottom of driver 32 has a threaded bore at 88 and a pair of adajcent parallel smooth bores such as 80. A machine screw 96 adjustably secures a driver head member 100 to the bottom of driver 32. Driver head 100 has a flat component engaging surface 104, and angled surfaces such as 102. A central bore 90 is located in the center of head 100 and is in communication with a reduced diameter portion 92 and bore 94, the latter of the same diameter as bore 90. A machine screw 96 is received within these bores and extends upwardly to threadably engage bore 88. Bores 80 on driver 32 are aligned with bores such as 84 on head 100 and slidably receive alignment pins such as 86 which are fixedly held in bores 84. A compression spring 98 surrounds a portion of screw 96 and is biased between the bottom surface of driver 32 and the top surface of driver head 100. The spring is activated when the driver bar 32 travels downwardly more than is necessary to insure engagement between the body of a component and the printed circuit board.

Figure 4:
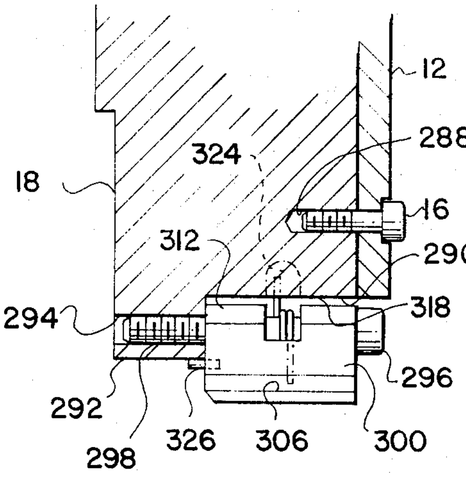
FIG. 4 is a sectional view of part of the housing showing the attachment of one of the socket holding latches.
Figure 3:
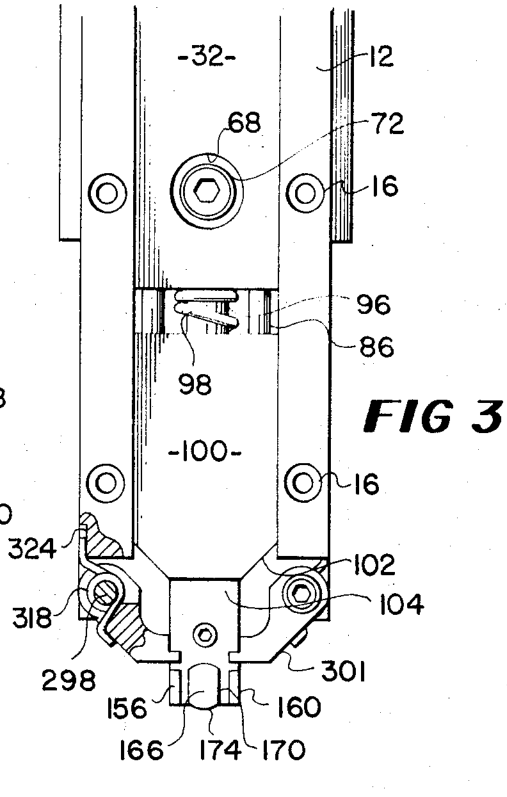
FIG. 3 is a front view of the lower half of the apparatus of FIG. 1.
Figure 8:
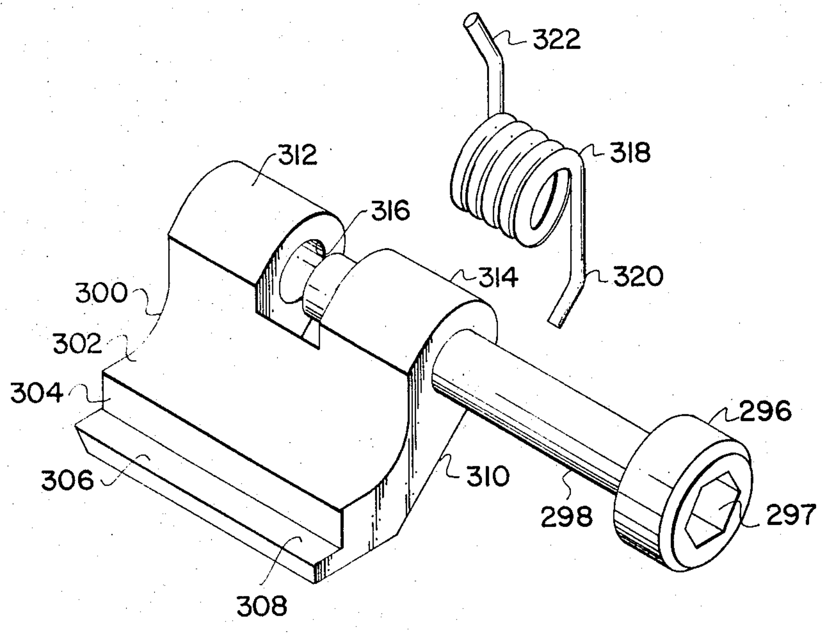
FIG. 8 is an exploded view of one of the socket holding latches.

Mounted on the bottom of members 18 and 19 are latches 300 and 301, shown in FIGS. 1, 3, 4 and 8. The latches are identical and only one is described in detail. Referring to FIGS. 8, latch 300 is shown as having a curved surface 302, a vertical cut 304, a horizontal surface 306, and a component engaging and retaining edge 308. The rear of latch 300 is relieved as at 310 and a pair of wing members 312 and 314 are bored as at 316 to receive the smooth portion of a machine screw 298 having a head portion 296 and hexagonal recession 297. A spring 318 having extending portions 320 and 322 is adapted to surround machine screw 298 between wings 312,314. Extending portion 320 is adapted to engage relieved surface 310, as shown in FIG. 3 and extending portion 322 is adapted to engage in a notch 324 in the lower portion 292 of the housing (FIGS. 3 and 4). The threaded portion of machine screw 298 engages a threaded bore 294 in portion 292. Machine screw 16 secures front plate 12 to the housing and is received within threaded bore 288. Each latch member has a stud, such as 326 (FIG. 4) which prevents it from rotating up toward insertion head 100. Components are held in position by the edges, such as 308, of the latches. The components, as was previously stated, can be fed into the latch area by any number of conventional mechanisms, none of which form any part of this invention.

Mounted between members 18,19 and the part of the yoke between block 20 and member 22 are a pair of vertical guide members 258 and 260. They are identical opposites in configuration so only one is shown and described, namely guide 260 in FIG. 5.

Guide 260 has a thin upper portion 264, a wider intermediate portion 278, notch 266 and a lower intermediate portion 276. The juncture of portions 276 and 278 is relieved as at 270 and further cut away as at 274 to provide thin portion 272 and notch 280. The opposite side of portion 276 is cut away as at 282 to provide lower depending portion 284. Holes 268 and 286 are adapted for mounting the guides to members 18 and 19. Guides 260 and 258 serve to align the yoke and driver bar 32 during its vertical movement.

Referring now to FIGS. 1, 5 and 6, there is shown the linkage assembly for swinging the lead aligning assembly out of the path of the driver. Link 64 is received between ears 108, 110 of member 22 and is pivoted therebetween by a pin 60 (FIG. 1) passing through bore 62 in one end of link 64 and the holes such as 112 in the ears.

The opposite end of link 64 has a hole 122 therein for receiving a pin 240 (FIG. 1) to secure it to a connecting yoke 238 which, in turn, is secured to a piston rod 242 and held in position by adjustment nut 244. Piston rod 242 has its upper extremity 250 received in a flange 252 of piston 254. Piston 254 has a sealing gasket 256 therearound and is mounted for movement within cylinder 248. Cylinder 248 is received within counterbore 37 (FIG. 5) of block 20 and bore 39 accommodates piston rod bearing 246 (FIG. 1).

Link 64 has holes such as 124 (FIG. 6) for receiving pins such as 65 (FIG. 1) which also pass through holes such as 126,128 (FIG. 6) in the flanges on either side of a notched portion 132 of a support member 130 to secure the member 130 to link 64. The upper portion of member 130 is canted as at 134. The front face 136 of member 130 has an aperture 138 for receiving the head portion 76 of machine screw 72. Bores 140, 142 and 144 are located at the bottom of the front face of member 136. Bore 140 receives a threaded machine screw 141 (FIG. 1) which acts as an adjustable depth stop for components of varying body sizes when placed between latches 300 and 301.

Figure 7:
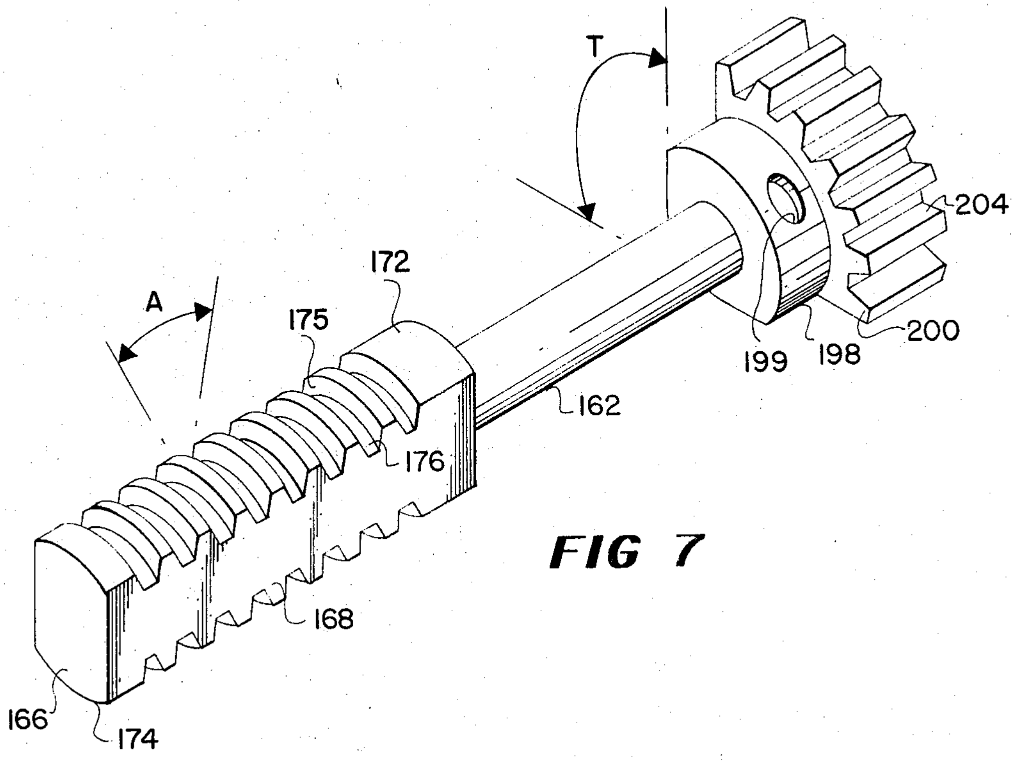
FIG. 7 is a perspective view of the grooved lead aligner.

Bores 142 and 144 received the shafts 201 and 162 of gears 200 and 196, recpectively. Gear 196 has teeth 206 and a flange 198 having a threaded bore 199 (FIG. 7) for receiving an insert screw to lock the flange and gear onto the end of shaft 162. Shaft 162 terminates at its opposite end in grooved member 170 (FIGS. 6 and 7) having opposed flat walls such as 168 and opposed concave surfaces such as 172 and 174. In the concave surfaces are a plurality of grooves 176 having walls 175. Member 170 terminates in flat end surface 166.

Gears 196 and 200 engage rack member 210 having a pin stop 212 and bore 214. Bore 214 receives pin 216 which locks it to offset 222 having curved face 220 with bore 218 therein which receives pin 216. Offset 222 receives the end of piston rod 224 and is secured thereto by inset screw 226.

The rack 210, gears 196 and 200 and offset 222 are contained in housing 178. A notch 190 having curved surface 192 allows pin stop 212 to protrude from housing 178 and also acts as a limit stop for the travel of rack 210. Housing 178 has a bore 182 in the top thereof which receives flange 230 of cylinder 228. The upper end 232 (FIG. 1) of piston rod 224 has piston flanges 228 and 234 therein and gasket seal 236 therebetween.

The bottom of member 130 is notched as at 146 and has bores such as 150 for receiving small machine screws, such as 161 in FIG. 1, to lock members 156 and 160 in place. The machine screws pass through holes such as 154 and countersunk hole 152. Members 156 and 160 are identical and have extending portions such as 158 adapted to cooperate with grooved member 170, when the latter is rotated, to align the leads.

Members 18 and 19 are held to a backing plate 46 (FIG. 1) by machine screws such as 51. A spacer block 44 is provided between members 18 and 19 to provide rigidity to the apparatus. Spacer block 44 is held in place by machine screws 58 engaging recess 54 and threaded bore 56. The backing plate can be attached to a main support structure such as 52 by studs 50 passing through bores therein such as 48.

The operation of the device is simple and efficient. A socket C is placed between latch members 300 and 301 (FIG. 1) with its leads depending down on either side of member 170 and internally adjacent members 156 and 160. Cylinder 228 is then activated allowing members 170 to rotate, the amount of rotations being controlled by the travel of pin stop 212. Gear 200 serves as an idler gear. The leads L are pressed between grooves 176 and the walls of members 156,160 and aligned.

Bar 32 is then forced downwardly by any suitable means and forces yoke member 22,20, link 64, and support member down with it. When member 22 strikes stop block 116, pin 26 begins to compress spring 28 as the downward movement of bar 32 continues. The cylinder 228 is then deactivated, rotating member 170 back to its initial position as shown in FIG. 3. Subsequently, cylinder 248 is activated, thus pivoting link 64 about pin 60 and moving support member 130 away from bar 32. As this pivot point goes lower, i.e., pin 60, the continued downward movement of bar 32 forces member 130 and consequently, the aligning mechanism out of the path of head 100, as shown in the phantom lines in FIG. 1. Driver or insertion head 100 continues down, its beveled surfaces such as 102 engaging the rounded surfaces of wings 312,314 of the latches 300 and 301 and forcing them to pivot out of its path. At this point, the leads have already entered predrilled holes in the PCB and the bar 32 continues to push the component into the board. A slight amount of overstroke is desired and compensated for by spring 98 between bar 32 and head 100 taking up this extra amount of stroke of bar 32 once the component C is seated. The bar and head 100 then withdraw and the cycle is repeated.

While only one embodiment of this invention has been shown and described, it will be obvious to those of ordinary skill in the art that many changes and modifications can be made without departing from the scope of the appended claims. For example, this apparatus could be utilized for aligning and inserting dual in-line components (DIPs) or other similarly shaped components.

What is claimed is:

1. An apparatus for receiving dual in-line sockets, aligning the leads and inserting them into predetermined holes in a circuit board, said apparatus comprising a housing, means on said housing for receiving and holding said components, a lead aligning means pivotally connected to said housing and located between and below said component holding means for engaging, aligning and disengaging said leads, driver means located above said component holding means and lead aligning means and adapted to move vertically, said component holding means adapted to carry said components vertically to said circuit board until the leads of the component enter said predetermined holes and then part to allow said driver to insert said component, linkage means associated with said driver means and said lead aligner means and adapted to swing said lead aligner means out of the vertical path of said driver means after lead disengagement when said driver reaches a predetermined point in its downward travel.

2. An apparatus as in claim 1 wherein said lead aligning means comprises a pair of spaced-apart elongated rectangular members, a rotatable lead engaging and forming means located between said members, said rotatable means being configured so as to engage the leads of a component being held by said component holding means upon commencing rotation and align them in conjunction with said spaced-apart members upon a further amount of rotation.

3. An apparatus as in claim 2 wherein said rotatable member comprises a shaft with an enlarged portion thereon, said portion having a pair of opposed, convex grooved surfaces thereon for engaging leads of a component.

4. An apparatus as in claim 2 wherein said lead aligning means includes a pneumatic cylinder means, said rotatable means having a shaft, a gear and rack means, said cylinder in operative assocation with said rack means, said gear on said shaft and in operative association with said rack means whereby powering of said cylinder means causes said rotatable means to rotate between said spaced-apart members.

5. An apparatus as in claim 4 and including and idler gear in operative association with said first gear and said rack means.

6. An apparatus as in claim 1 wherein said driver comprises a bar and a driver head, said head having a component engaging surface, beveled surfaces on each side of said component engaging surface, spring means connecting said driver head to said bar, said beveled surfaces adapted to engage said component holding means when said bar is moving downwardly to swing said holding means out of the path of said driver.

7. An apparatus as in claim 1 wherein said component holding means comprises a pair of pivoted latches, said latches having complementary surfaces thereon on which the body of a component may rest, and spring means biasing said latches to a holding position but adapted to allow said latches to be engaged by said driver and swung out of the way.

8. An apparatus as in claim 1 wherein said linkage means comprises a cut-out area in said driver, a yoke means mounted for vertical movement with said driver, said yoke means having a pair of ears protruding into said cut-out area, a link protruding into said cut-out area and having one end pivoted to said ears, a pneumatic cylinder on said yoke means and having a piston rod extending therefrom, the other end of said link being pivoted to said piston rod, a supporting member attached to said link at its upper end and supporting said lead aligning means on its lower end, said cylinder adapted to swing said supporting member and lead aligning means out of the path of said driver.

9. An apparatus as in claim 8 wherein said yoke means has a bore therein, a guide pin connected to said driver and extending into said bore, a compression spring in said bore, a stop member on said driver for halting the downward travel of said yoke means with said driver, the spring being compressed by said pin as said driver continues its descent.

10. An apparatus as in claim 2 and including an adjustment means associated with said lead aligning means whereby the size of the component the receiving means is adapted to accommodate can be varied.

* * * * *